(12) United States Patent
Chen et al.

(10) Patent No.: US 11,184,010 B1
(45) Date of Patent: Nov. 23, 2021

(54) RECEIVING END OF ELECTRONIC DEVICE AND METHOD OF SETTING PHASE THRESHOLD OF TIMING RECOVERY OPERATION

(71) Applicant: REALTEK SEMICONDUCTOR CORPORATION, Hsinchu (TW)

(72) Inventors: Yan-Guei Chen, Hsinchu (TW); Hsin-Yu Lue, Hsinchu (TW); Liang-Wei Huang, Hsinchu (TW); Hui-Min Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/355,224

(22) Filed: Jun. 23, 2021

(30) Foreign Application Priority Data

Jun. 30, 2020 (TW) ................................. 109122065

(51) Int. Cl.
*H03L 7/085* (2006.01)
*H03L 7/08* (2006.01)

(52) U.S. Cl.
CPC ............ *H03L 7/085* (2013.01); *H03L 7/0807* (2013.01)

(58) Field of Classification Search
CPC .............................. H03L 7/085; H03L 7/0807
See application file for complete search history.

(56) References Cited

U.S. PATENT DOCUMENTS

| | | | |
|---|---|---|---|
| 8,536,911 B1* | 9/2013 | Nakamuta | H03L 7/06 327/156 |
| 9,705,515 B1* | 7/2017 | Lee | H03L 7/183 |
| 10,666,418 B1 | 5/2020 | Chen et al. | |
| 2010/0027611 A1* | 2/2010 | Dai | H04L 25/03057 375/233 |
| 2012/0319749 A1* | 12/2012 | Thaller | H03L 7/183 327/158 |
| 2013/0027102 A1* | 1/2013 | Chen | H03L 7/081 327/158 |
| 2013/0266103 A1* | 10/2013 | Bae | H03L 7/0807 375/354 |
| 2014/0177770 A1* | 6/2014 | Katumba | H04L 7/04 375/374 |
| 2014/0219327 A1* | 8/2014 | Kumar | H04L 25/03891 375/232 |
| 2015/0117579 A1* | 4/2015 | Shibasaki | H04L 7/0337 375/355 |

(Continued)

*Primary Examiner* — Adam D Houston
(74) *Attorney, Agent, or Firm* — WPAT, PC

(57) ABSTRACT

A receiving end of an electronic device includes an analog front end (AFE) circuit, a phase detector (PD), and a calculation circuit. The AFE circuit receives an input signal and adjusts the phase of the input signal according to a phase control signal. The PD detects the phase of the input signal to generate a current phase value and a phase difference accumulated value, calculates a target phase value according to the phase difference accumulated value, and generates a first phase driving value according to the target phase value and the current phase value. The calculation circuit generates the phase control signal according to the first phase driving value and a phase threshold. After the calculation circuit generates the phase control signal, the phase detector generates a second phase driving value, and the calculation circuit updates the phase threshold according to the first and second phase driving values.

9 Claims, 6 Drawing Sheets

(56) References Cited

U.S. PATENT DOCUMENTS

| | | | |
|---|---|---|---|
| 2016/0218722 A1* | 7/2016 | Lachartre | H03L 7/083 |
| 2018/0138911 A1* | 5/2018 | Kuo | H03L 7/0992 |
| 2018/0191489 A1* | 7/2018 | Banin | H04L 27/0014 |
| 2019/0004563 A1* | 1/2019 | Nelson | H03K 5/082 |
| 2019/0044693 A1* | 2/2019 | He | H04L 7/0016 |
| 2019/0109735 A1* | 4/2019 | Norimatsu | H04L 25/4917 |
| 2019/0156747 A1* | 5/2019 | Nie | G09G 3/3266 |
| 2019/0305926 A1* | 10/2019 | Li | G06F 13/4282 |

\* cited by examiner

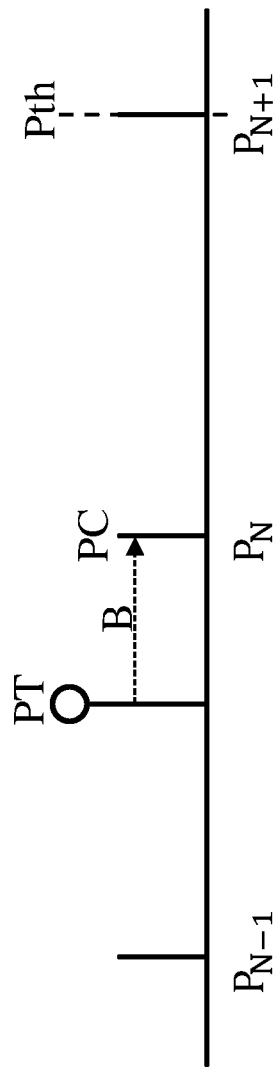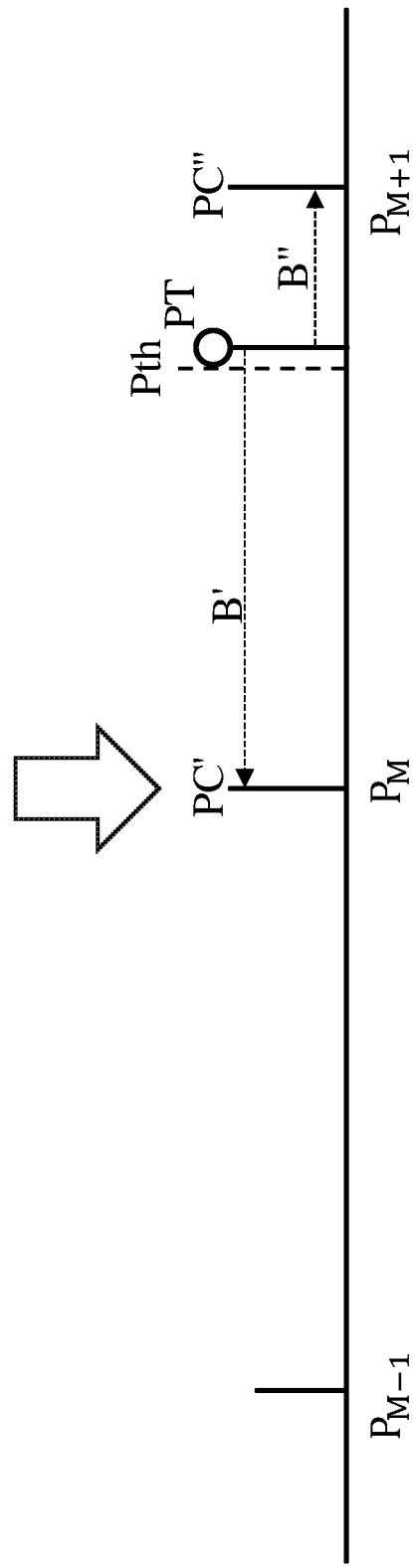
FIG. 6A
FIG. 6B

RECEIVING END OF ELECTRONIC DEVICE AND METHOD OF SETTING PHASE THRESHOLD OF TIMING RECOVERY OPERATION

BACKGROUND OF THE INVENTION

1. Field of the Invention

The present invention generally relates to timing recovery technology, and, more particularly, to a method of setting the phase threshold of the timing recovery operation and to the receiving end of an electronic device that implements the method.

2. Description of Related Art

In the process of transmitting and receiving a signal, the transmission time at the transmitting end and the reception time at the receiving end may be out of synchronization when the transmitting end and the receiving end are affected by the external environment or the jitter effect. The degree of out of synchronization may be as small as a few phase differences, or so large that the frequencies at the transmitting end and the receiving end become different. The receiving end uses a timing recovery circuit to tackle this frequency or phase difference, and a suitable phase threshold is crucial to the stability of the system. A frequently switching phase is unfavorable to the convergence of the system. For example, various equalizers (e.g., the echo canceller, the feed forward equalizer, the feedback equalizer, etc.) tend to function improperly when operating in an unstable state (i.e., frequent phase switching), resulting in poor performance or malfunction of the system.

Therefore, a circuit and a method are needed to provide an appropriate phase threshold according to the current actual operating environment.

SUMMARY OF THE INVENTION

In view of the issues of the prior art, an object of the present invention is to provide a method of setting the phase threshold of the timing recovery operation and to provide the receiving end of the electronic device which implements the method.

A receiving end of an electronic device is provided. The receiving end of the electronic device includes an analog front end circuit, a phase detector, and a calculation circuit. The analog front end circuit is configured to receive an input signal and adjust a phase of the input signal according to a phase control signal. The phase detector is coupled to the analog front end circuit and configured to detect the phase of the input signal to generate a current phase value and a phase difference accumulated value, to calculate a target phase value according to the phase difference accumulated value, and to generate a first phase driving value according to the target phase value and the current phase value. The calculation circuit is coupled to the phase detector and the analog front end circuit and configured to generate the phase control signal according to the first phase driving value and a phase threshold. After the calculation circuit generates the phase control signal, the phase detector generates a second phase driving value, and the calculation circuit updates the phase threshold according to the first phase driving value and the second phase driving value.

A receiving end of an electronic device is provided. The receiving end of the electronic device includes an analog front end circuit, a phase detector, and a calculation circuit. The analog front end circuit is configured to receive an input signal and adjust a phase of the input signal according to a phase control signal. The phase detector is coupled to the analog front end circuit and configured to detect the phase of the input signal to generate a current phase value and a phase difference accumulated value, to calculate a target phase value according to the phase difference accumulated value, and to generate a first phase driving value according to the target phase value and the current phase value. The calculation circuit is coupled to the phase detector and the analog front end circuit and configured to generate the phase control signal according to the first phase driving value and a phase threshold. After the calculation circuit generates the phase control signal, the phase detector generates a second phase driving value, and the calculation circuit updates the phase threshold according to the phase threshold and the second phase driving value.

A method of setting a phase threshold of a timing recovery operation is provided. The method includes the following steps: (A) receiving an input signal; (B) detecting a phase of the input signal to generate a current phase value and a phase difference accumulated value; (C) calculating a target phase value according to the phase difference accumulated value; (D) generating a first phase driving value according to the target phase value and the current phase value; (E) generating a phase control signal according to the first phase driving value and a phase threshold; (F) adjusting the phase of the input signal according to the phase control signal; (G) repeating steps (A) to (C) to update the target phase value and the current phase value; (H) generating a second phase driving value according to the updated target phase value and the updated current phase value; and (I) updating the phase threshold according to an absolute difference between the first phase driving value and the second phase driving value, or according to an absolute difference between the phase threshold and the second phase driving value.

The phase threshold adjustment mechanism of the present invention can determine a new phase threshold according to the current phase interval. In comparison with the prior art, the present invention can prevent the receiving end from being out of synchronization in phase with the transmitting end due to failing to adjust the phase in time, as well as prevent the transient error or the decreased signal-to-noise ratio (SNR) in the receiving end due to adjusting the phase too frequently.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIGS. 6A and 6B illustrate another example of phase change.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes method of setting a phase threshold of a timing recovery operation and a receiving end of an electronic device that implements the method. On account of that some or all elements of the receiving end of the electronic device could be known, the detail of such elements is omitted provided that such detail has little to do with the features of this disclosure, and that this omission nowhere dissatisfies the specification and enablement requirements. The method of setting a phase threshold can be performed by the receiving end of the electronic device or its equivalent. A person having ordinary skill in the art can choose components or steps equivalent to those described in this specification to carry out the present invention, which means that the scope of this invention is not limited to the embodiments in the specification.

Figure 1:
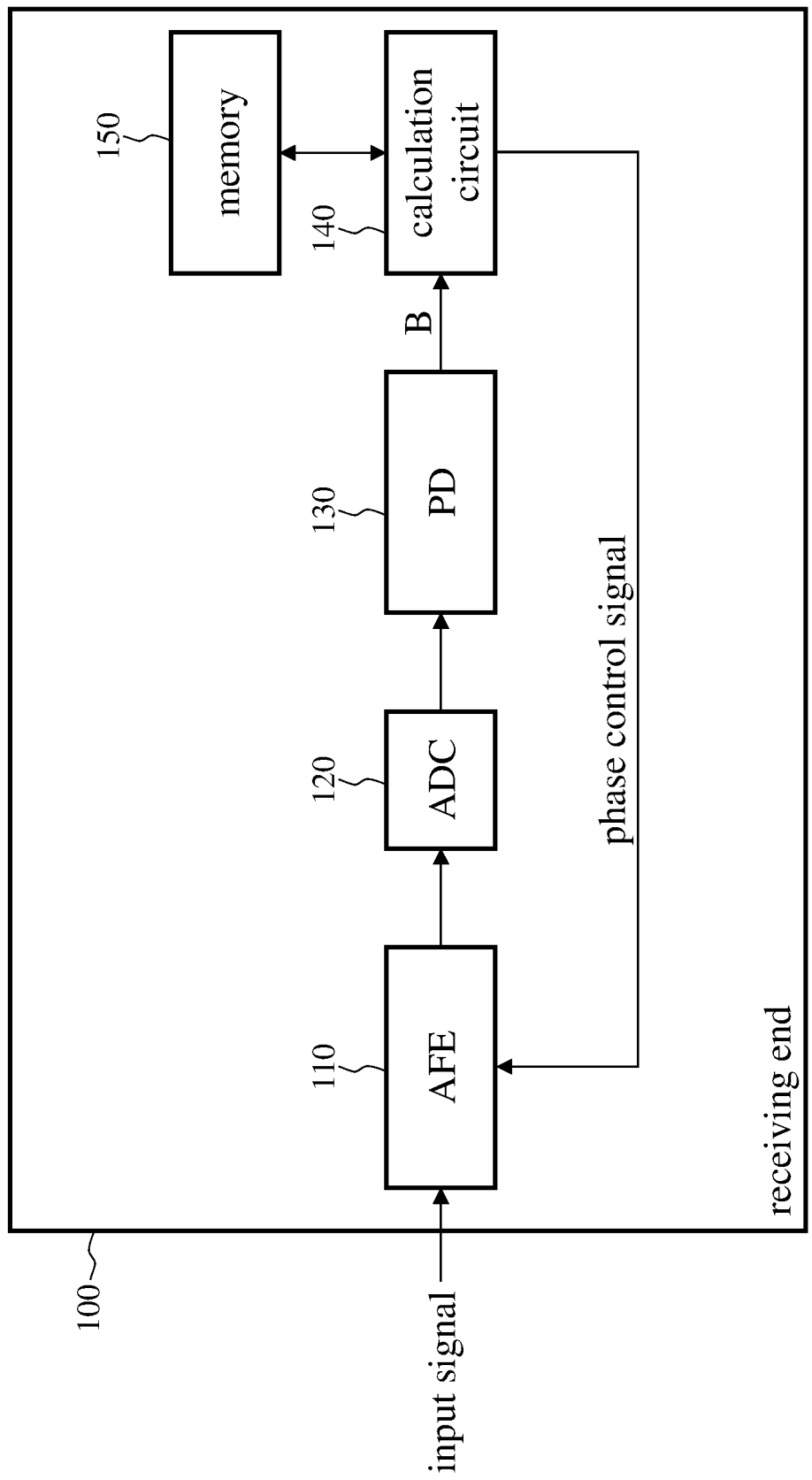
FIG. 1 illustrates a functional block diagram of the receiving end of the electronic device according to an embodiment of the present invention.
Figure 2:
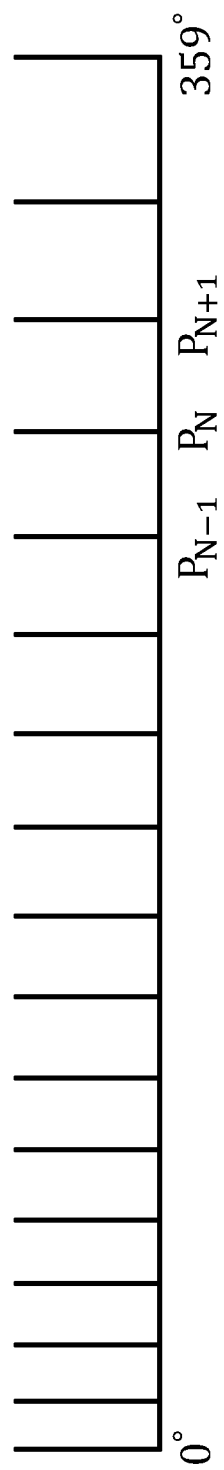
FIG. 2 illustrates a schematic diagram of the phase intervals in one period.

FIG. 1 is a functional block diagram of the receiving end of the electronic device according to an embodiment of the present invention. The receiving end 100 includes an analog front end (AFE) circuit 110, an analog-to-digital converter (ADC) 120, a phase detector (PD) 130, a calculation circuit 140, and a memory 150. The AFE circuit 110 is controlled by the phase control signal to adjust the phase of the input signal. The AFE circuit 110 divides a period into multiple phase intervals, according to which the adjustment of the phase is performed. In practice, due to the limitation of the circuit itself, the phase intervals are not equal. FIG. 2 is a schematic diagram illustrating the phase intervals within one period. As shown in FIG. 2, the phase intervals close to 0 degrees are relatively narrow, while the phase intervals close to 359 degrees are relatively wide. FIG. 2 is only an example of uneven phase intervals. The present invention is not limited to this example and can also be applied to other kinds of uneven phase intervals.

In some embodiments, the phase control signal controls the AFE circuit 110 to make the phase of the input signal larger (i.e., increase the phase) or make the phase of the input signal smaller (i.e., decrease the phase). For example, a phase control signal of a high voltage level controls the AFE circuit 110 to adjust the phase of the input signal from $P_N$ to $P_{N+1}$, and a phase control signal of a low voltage level controls the AFE circuit 110 to adjust the phase of the input signal from $P_N$ to $P_{N-1}$. In some embodiments, the calculation circuit 140 controls the AFE circuit 110 to adjust the phase of the input signal by one phase interval (increase or decrease) at a time.

Figure 3:
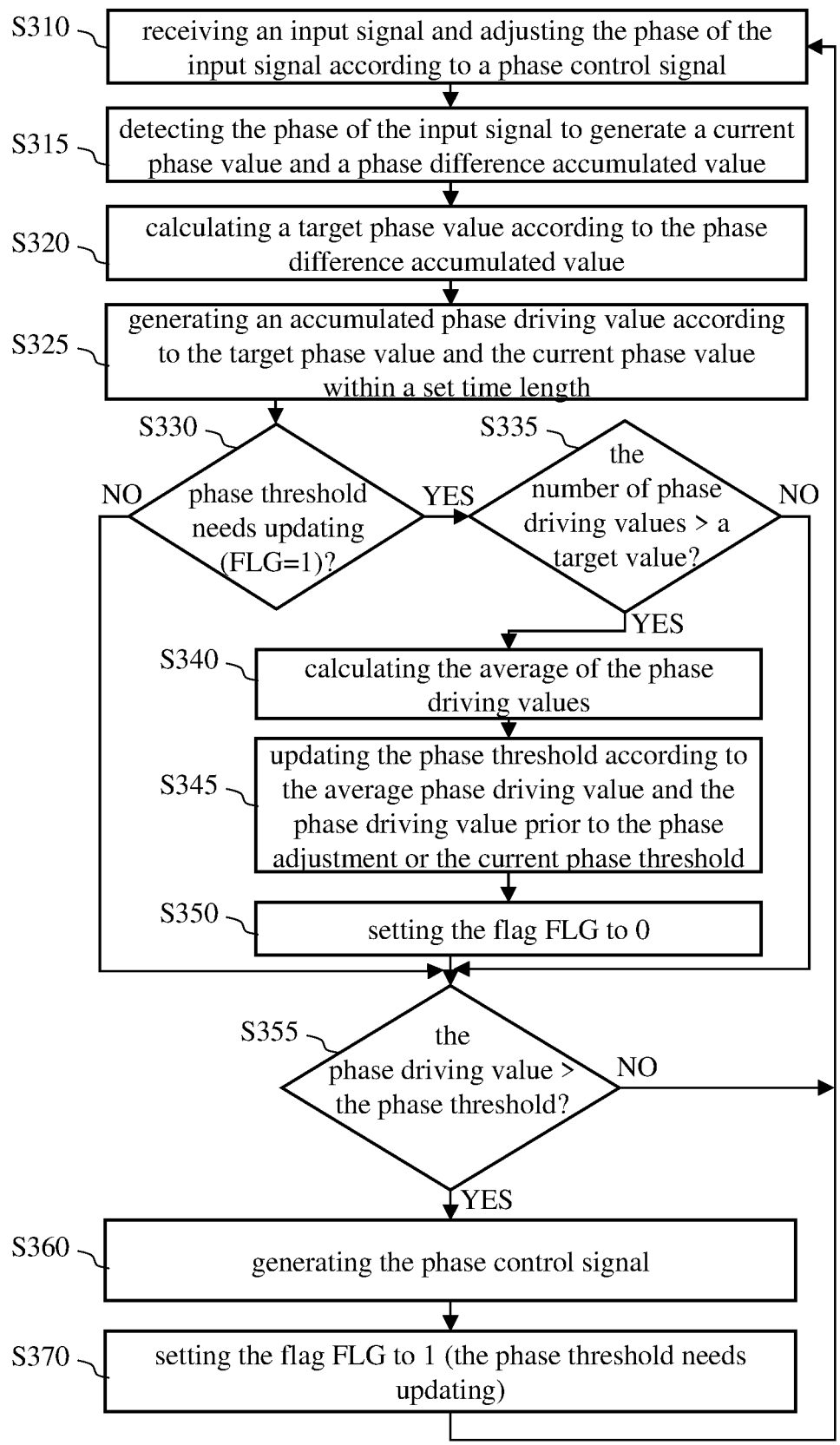
FIG. 3 illustrates a flowchart of setting the phase threshold of the timing recovery operation according to an embodiment of the present invention.

Reference is made to FIG. 1 to FIG. 3 for the discussions below. FIG. 3 is a flowchart of setting the phase threshold of the timing recovery operation according to an embodiment of the present invention. The AFE circuit 110 receives the input signal and adjusts the phase of the input signal according to the phase control signal (step S310), and then the ADC 120 converts the input signal from the analog domain to the digital domain. In each period of the input signal, the phase detector 130 detects the phase of the input signal to generate a current phase value and a phase difference accumulated value (step S315) and calculates the target phase value according to the phase difference accumulated value (step S320). In the current operating environment, if the AFE circuit 110 adjusts the phase of the input signal to the target phase value, the receiving end 100 will operate in a better state (e.g., a better signal-to-noise ratio (SNR)). In other words, the target phase value is the ideal phase of the input signal under the current operating environment. The calculations of the current phase value, the phase difference accumulated value, and the target phase value are techniques well known to people having ordinary skill in the art, so the details shall be omitted herein for brevity (Please refer to: Wolaver, Dan H. (1991), *Phase-Locked Loop Circuit Design*, Prentice Hall, ISBN 0-13-662743-9). The phase detector 130 further generates an accumulated phase driving value according to the target phase value and the current phase value within a set time length (e.g., Y unit time in the digital domain, which unit time may be, for example, the period of a system clock, Y is a positive integer) (step S325, which will be discussed in detail below). After receiving the phase driving value, the calculation circuit 140 may store it in the memory 150.

After receiving the phase driving value from the phase detector 130, the calculation circuit 140 determines whether the phase threshold needs updating (e.g., to determine whether the flag FLG is 1, the flag FLG can be stored in the memory 150) (step S330). If the result of step S330 is YES (e.g., the flag FLG=1), the calculation circuit 140 determines whether the number of accumulated phase driving values is greater than a target value (step S335). When the number of accumulated phase driving values is greater than the target value (the result of step S335 is YES), the calculation circuit 140 calculates the average of the phase driving values (step S340). The purpose of step S335 and step S340 is to prevent frequent updating of the phase threshold due to the instantaneous extreme value of the phase driving value; these two steps are beneficial to improve the stability and accuracy of the process in FIG. 3.

However, in some embodiments, the calculation circuit 140 does not calculate the average of the phase driving values (i.e., step S335 and step S340 are not performed); instead, the calculation circuit 140 performs step S345 after determining that the phase threshold needs updating (the result of step S330 is YES). In the embodiment where the average of the phase driving values is not calculated, the calculation circuit 140 updates, in step S345, the phase threshold according to the current phase driving value and the phase driving value prior to the phase adjustment or, alternatively, updates the phase threshold according to the current phase driving value and the current phase threshold. Step S345 will be discussed in detail below.

When the number of accumulated phase driving values is greater than the target value (the result of step S335 is YES), the calculation circuit 140 calculates the average of the phase driving values (step S340) and then updates the phase threshold according to both the average value and the phase driving value prior to the phase adjustment, or according to both the average value and the current phase threshold (step S345, which will be discussed in detail below). After the phase threshold is updated, the calculation circuit 140 sets the flag FLG to 0 which indicates that the phase threshold does not need updating (step S350).

When the result of step S330 is NO, or the result of step S335 is NO, the calculation circuit 140 determines whether the phase driving value is greater than the phase threshold (step S355). If the result of step S355 is NO, the process returns to step S310, and the AFE circuit 110 proceeds to receive the input signal. In other words, when the phase driving value is not greater than the phase threshold, the calculation circuit 140 does not perform step S360 (i.e., does not generate the phase control signal).

If the result of step S355 is YES, the calculation circuit 140 generates the phase control signal (step S360) and sets the flag FLG to 1 which indicates that the phase threshold needs updating (step S370). Steps S360 and S370 will be discussed in detail below in connection with FIG. 4.

Figure 4:
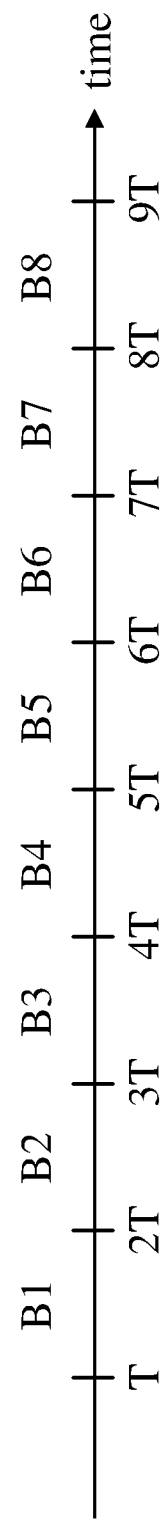
FIG. 4 shows that the phase detector 130 generates an accumulated phase driving value B in each period.

FIG. 4 shows that the phase detector 130 generates an accumulated phase driving value B in each period: the phase driving value B1 is generated between time points T and 2T (T is the period of the input signal), the phase driving value B2 is generated between time points 2T and 3T, the phase driving value B3 is generated between time points 3T and 4T, and so on. Assuming that the phase driving value B3 is greater than the phase threshold (the result of step S355 is YES), the calculation circuit 140 generates the phase control signal to control the AFE circuit 110 to adjust the phase of the input signal (step S360) and sets the flag FLG to 1 (step S370). Taking FIG. 4 as an example and assuming that the target value of step S335 is three and the phase driving values B4, B5, and B6 are not greater than the phase threshold, the calculation circuit 140 calculates the average of the phase driving values B4, B5, and B6 in step S340, and then, in step S345, the calculation circuit 140 updates the phase threshold according to the average phase driving value (i.e., the average of B4, B5 and B6) and the phase driving value prior to the phase adjustment (i.e., B3) or, alternatively, updates the phase threshold according to the average phase driving value and the current phase threshold.

Figure 5A:
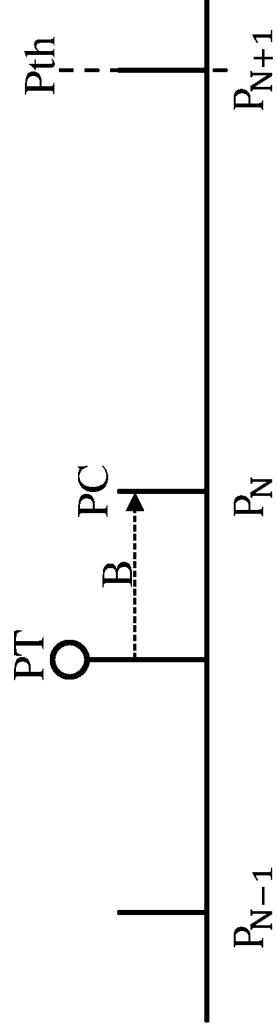
FIGS. 5A and 5B illustrate an example of phase change.
Figure 5B:
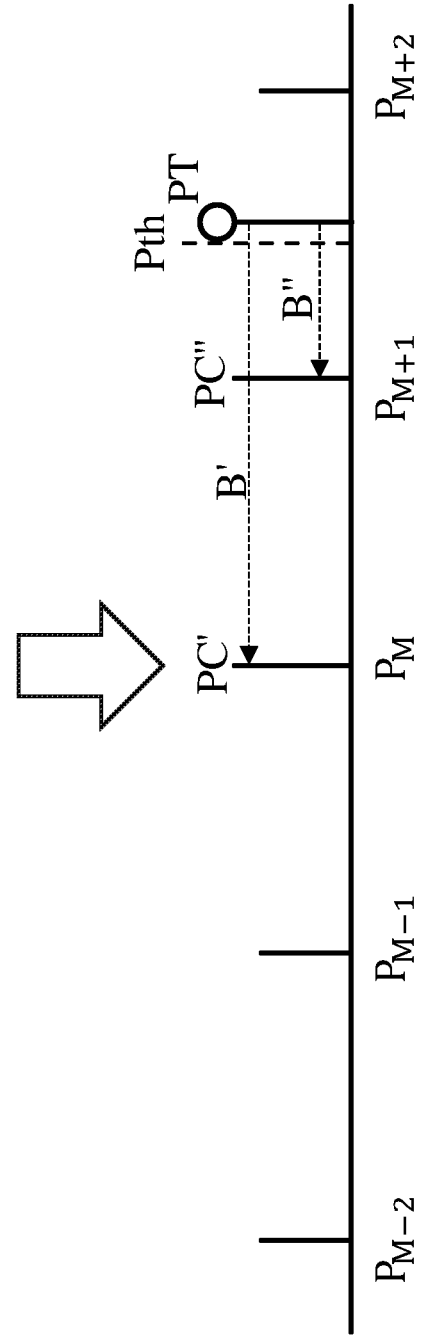

In the following, the steps of FIG. 3 and the operation details of the phase detector 130 and the calculation circuit 140 are discussed in detail by referring to the phase changes shown in FIGS. 5A and 5B. FIGS. 5A and 5B show the relationships between the target phase value PT, the current phase value PC, the phase threshold $P_{th}$, and the phase driving value B. In the example of FIGS. 5A and 5B, the AFE circuit 110 was operating in the range of wide phase intervals (as shown in FIG. 5A, the current phase value PC corresponds to the phase $P_N$, which is in the range of wide phase intervals (e.g., $|P_{N+}-P_N|$)). After a period of time, due to changes in the environment (such as the voltage or temperature), the AFE circuit 110 has become to operate in the range of narrow phase intervals (as shown in FIG. 5B, the current phase value PC' corresponds to the phase $P_M$, which is in the range of narrow phase intervals (e.g., $|P_{M+1}+P_M|$)) (where $|P_{M+1}-P_M|<|P_{N+1}-P_N|$).

The phase driving value is the difference between the target phase value and the current phase value (i.e., B=PT−PC, B'=PT−PC', B"=PT−PC"). A smaller absolute value of the phase driving value B (or B', B") indicates that the receiving end 100 is operating in a relatively stable state. A greater absolute value of the phase driving value B (or B', B") indicates that the receiving end 100 is operating in a relatively unstable state (which means that the AFE circuit 110 may be about to adjust the phase of the input signal or must immediately adjust the phase of the input signal).

It is assumed in FIGS. 5A and 5B that the magnitude of the old (i.e., prior to the update) phase threshold $P_{th}$ is set to correspond to a phase interval (i.e., $P_{th}$ corresponds to $P_{N+1}-P_N$). Since the magnitude of the phase driving value B is smaller than the phase threshold $P_{th}$ in the example of FIG. 5A, the result of step S355 in FIG. 3 is NO.

In FIG. 5B, when the absolute value of the difference between the target phase value PT and the current phase value PC' (i.e., the absolute value of the phase driving value B') is greater than the old phase threshold $P_{th}$ (i.e., $|B'|>P_{th}$, the result of step S355 is YES), the calculation circuit 140 generates the phase control signal (step S360) and sets the flag FLG to 1 (step S370). In this instance, since the phase driving value B' is a positive number (because the target phase value PT is greater than the current phase value PC'), in the next step S310 the AFE circuit 110 switches, according to the phase control signal, the current phase value of the input signal from PC' (corresponding to the phase $P_M$) to PC" (corresponding to the phase $P_{M+1}$).

Even though the AFE circuit 110 has adjusted the phase of the input signal, the two target phase values PT generated in two consecutive steps S320 are very similar because the operating environment of the receiving end 100 usually does not change significantly in a short period of time. In other words, as shown in FIG. 5B, within a short period of time (depending on the operating environment) after the current phase value has just changed from the current phase value PC' to the current phase value PC", the change of the target phase value PT is 0 or very small.

Next, the phase detector 130 generates a phase driving value B" in step S325. The calculation circuit 140 updates the phase threshold $P_{th}$ according to the phase driving value B" (or the average of multiple phase driving values B") and the phase driving value B', or according to the phase driving value B" (or the average of multiple phase driving values B") and the old phase threshold $P_{th}$ (step S345). More specifically, in some embodiments, the new (updated) $P_{th}\propto\alpha|B"-\overline{B"}|$ ($\overline{B"}$ is an average of multiple phase driving values B", where $\alpha$ (a rational number) is the multiple ratio). In other embodiments, when the target phase value PT is very close to the phase threshold $P_{th}$ (i.e., when $B'\cong P_{th}$), $P_{th}'=\alpha|P_{th}-\overline{B"}|$. In the embodiment where the average of the phase driving values B is not calculated (i.e., steps S335 and S340 are skipped), $\overline{B"}=B"$. In some embodiments, $\alpha=1$, that is, the new $P_{th}'=|B'-\overline{B"}|$ (or $P_{th}=|P_{th}-\overline{B"}|$). Taking FIG. 5B as an example, when $\alpha=1$, $P_{th}'$ is approximately at the position of the current phase value PC".

As shown in FIG. 5B, $|B'-\overline{B"}|$ can reflect the distance between the phase $P_{M+1}$ and the phase $P_M$ (i.e., the current phase interval, that is, the current differential nonlinearity (DNL)). In other words, the new $P_{th}'$ is determined based on the current phase interval, so the new $P_{th}'$ is proportional to the current phase interval.

FIGS. 6A and 6B show another example of phase change. In this example, the AFE circuit 110 which was operating in the range of narrow phase intervals (as shown in FIG. 6A) has gradually become to operate in the range of wide phase intervals (as shown in FIG. 6B). In the example of FIG. 6, since the phase driving value B' is a positive number (because the target phase value PT is greater than the current phase value PC'), which is the same as the case in FIG. 5, the AFE circuit 110 switches, according to the phase control signal, the current phase value of the input signal from PC' (corresponding to the phase $P_M$) to PC" (corresponding to the phase $P_{M+1}$) (step S310). In FIG. 6B, since the target phase value PT is smaller than the current phase value PC", the phase driving value B" is a negative number (B"=PT−PC"<0). Similar to FIG. 5B, because $|B'-\overline{B"}|$ ($=B'+|\overline{B"}|$) reflects the phase interval of FIG. 6B (i.e., the distance between the phase $P_{M+1}$ and the phase $P_M$), the new $P_{th}'=\alpha|B'-\overline{B^m}|$ is also determined according to the current phase interval (proportional to $|B'-\overline{B^m}|$).

The phase threshold adjustment mechanism discussed above can determine a new phase threshold according to the phase range (a range of wide phase intervals or narrow phase intervals) in which the AFE circuit 110 is currently operating. Therefore, when the current phase value PC of the AFE circuit 110 shifts from a wide phase interval to a narrow phase interval (as the case of FIG. 5), the calculation circuit 140 decreases the phase threshold $P_{th}$ to avoid being out of synchronization with the transmitting end due to the system's failing to adjust the phase in time. On the other hand, when the current phase value PC of the AFE circuit 110 shifts from a narrow phase interval to a wide phase interval (as the case of FIG. 6), the calculation circuit 140 increases the phase threshold $P_{th}$ to avoid a transient error or a decreased SNR in the system due to frequent phase adjustments.

People having ordinary skill in the art can implement the calculation circuit 140 with logic circuits, a digital signal processor (DSP), a finite state machine, or equivalent circuits according to the flow in FIG. 3. The receiving end 100 can be applied in a wired environment or a wireless environment.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flowchart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A receiving end of an electronic device, comprising:
    an analog front end circuit configured to receive an input signal and adjust a phase of the input signal according to a phase control signal;
    a phase detector coupled to the analog front end circuit and configured to detect the phase of the input signal to generate a current phase value and a phase difference accumulated value, calculate a target phase value according to the phase difference accumulated value, and generate a first phase driving value according to the target phase value and the current phase value; and
    a calculation circuit coupled to the phase detector and the analog front end circuit and configured to generate the phase control signal according to the first phase driving value and a phase threshold;
    wherein after the calculation circuit generates the phase control signal, the phase detector generates a second phase driving value, and the calculation circuit updates the phase threshold according to the first phase driving value and the second phase driving value.

2. The receiving end of the electronic device of claim 1, wherein the calculation circuit calculates an absolute difference between the first phase driving value and the second phase driving value and multiplies the absolute difference by a multiple ratio to generate the phase threshold.

3. The receiving end of the electronic device of claim 2, wherein the multiple ratio is one.

4. A receiving end of an electronic device, comprising:
    an analog front end circuit configured to receive an input signal and adjust a phase of the input signal according to a phase control signal;
    a phase detector coupled to the analog front end circuit and configured to detect the phase of the input signal to generate a current phase value and a phase difference accumulated value, calculate a target phase value according to the phase difference accumulated value, and generate a first phase driving value according to the target phase value and the current phase value; and
    a calculation circuit coupled to the phase detector and the analog front end circuit and configured to generate the phase control signal according to the first phase driving value and a phase threshold;
    wherein after the calculation circuit generates the phase control signal, the phase detector generates a second phase driving value, and the calculation circuit updates the phase threshold according to the phase threshold and the second phase driving value.

5. The receiving end of the electronic device of claim 4, wherein the calculation circuit calculates an absolute difference between the phase threshold and the second phase driving value and multiplies the absolute difference by a multiple ratio to generate the phase threshold.

6. The receiving end of the electronic device of claim 5, wherein the multiple ratio is one.

7. A method of setting a phase threshold of a timing recovery operation, comprising:
    (A) receiving an input signal;
    (B) detecting a phase of the input signal to generate a current phase value and a phase difference accumulated value;
    (C) calculating a target phase value according to the phase difference accumulated value;
    (D) generating a first phase driving value according to the target phase value and the current phase value;
    (E) generating a phase control signal according to the first phase driving value and a phase threshold;
    (F) adjusting the phase of the input signal according to the phase control signal;
    (G) repeating steps (A) to (C) to update the target phase value and the current phase value;
    (H) generating a second phase driving value according to the updated target phase value and the updated current phase value; and
    (I) updating the phase threshold according to an absolute difference between the first phase driving value and the second phase driving value, or according to an absolute difference between the phase threshold and the second phase driving value.

8. The method of claim 7, wherein step (I) multiplies the absolute difference by a multiple ratio to generate the phase threshold.

9. The method of claim 8, wherein the multiple ratio is one.

* * * * *